United States Patent [19]
Yamagata

[11] Patent Number: 5,024,721
[45] Date of Patent: Jun. 18, 1991

[54] METHOD OF FORMING METAL SURFACE THIN FILM HAVING HIGH CORROSION RESISTANCE AND HIGH ADHESION

[75] Inventor: Hiroshi Yamagata, Tateyama, Japan
[73] Assignee: Yoshida Kogyo K.K., Tokyo, Japan
[21] Appl. No.: 565,556
[22] Filed: Aug. 10, 1990
[30] Foreign Application Priority Data Aug. 24, 1989 [JP] Japan .................................. 1-216011

[51] Int. Cl.⁵ ........................... B44C 1/22; C23F 1/00; C23C 14/00; C23C 14/32
[52] U.S. Cl. ..................................... 156/643; 156/646; 156/665; 204/192.3; 427/38; 427/309
[58] Field of Search ................ 156/643, 646, 656, 664, 156/665; 204/129.1, 129.35, 192.16, 192.3, 192.32, 192.35; 427/38, 39, 309

[56] References Cited
U.S. PATENT DOCUMENTS 3,829,969  8/1974  Fischbein et al. .......... 204/192.16 X
4,428,812  1/1984  Sproul ........................... 204/192.3 X Primary Examiner—William A. Powell
Attorney, Agent, or Firm—Flynn, Thiel, Boutell & Tanis

[57] ABSTRACT

The present invention provides a method of forming metal surface thin film having high corrosion resistance and high adhesion by carrying out sequentially the following steps a) through c): a) an etching step carried out by applying a negative D.C. voltage to a metal substrate inside an apparatus having an inert gas atmosphere; b) an oxide film formation step for forming an oxide film by generating an oxygen plasma inside an apparatus having an oxygen gas atmosphere and applying a positive voltage to the surface of the metal substrate; and c) a durable film formation step for forming a durable film by vapor phase deposition of a corrosion-resistant material onto the surface of the metal substrate inside the apparatus having inert gas atmosphere. In the formation method of the present invention, since the oxide film is formed between metal substrate and the durable film, the metal surface thin film exhibits a very high corrosion resistance.

1 Claim, 3 Drawing Sheets 5,024,721

METHOD OF FORMING METAL SURFACE THIN FILM HAVING HIGH CORROSION RESISTANCE AND HIGH ADHESION

BACKGROUND OF THE INVENTION

1. Field of the Invention

This invention relates to a formation method of a metal surface thin film which forms a metal surface thin film having high corrosion resistance and high adhesion by a physical or chemical vapor deposition method.

2. Description of the Prior Art

Heretofore, when a metal film of a different material from a metal substrate is formed on the surface of the metal substrate, it has been customary in the past to select a metal film made of a material having a lower spontaneous electrode potential than the metal substrate in order t prevent electrical corrosion.

In the formation of such a metal film, however, it has been necessary to select a material suitable for the metal substrate and when the metal substrate is made of a material having a low spontaneous electrode potential (for example, Al), a corrosion-resistant metal film cannot be formed on the surface of the metal substrate. If any pin-holes or the like exist on the metal film and reach the surface of the metal substrate, electrical corrosion develops from the pin-hole portions, because the metal film is in contact with the surface of the metal substrate.

SUMMARY OF THE INVENTION

It is therefore an object of the present invention to provide a method of forming a useful metal surface thin film on the surface of a metal substrate which solves the problems described above and prevents electrical corrosion of the substrate surface.

The present invention provides a method of forming a metal surface thin film having high corrosion resistance and high adhesion by carrying out sequentially the following steps a) through c):

a) an etching step carried out by applying a negative D.C. voltage to a metal substrate inside an apparatus having an inert gas atmosphere;

b) an oxide film formation step for forming an oxide film by generating an oxygen plasma inside an apparatus having an oxygen gas atmosphere and applying a positive voltage to the surface of the metal substrate; and c) a durable film formation step for forming a durable film by vapor phase deposition of a corrosion-resistant material onto the surface of the metal substrate inside the apparatus having an inert gas atmosphere.

DETAILED DESCRIPTION OF THE PREFERRED EMBODIMENTS

In the etching step a) described above, it is possible to use such an apparatus whose interior can be substituted by an inert gas, can keep the inert gas pressure at $5 \times 10^{-3}$ to $20 \times 10^{-3}$ mbar and can apply a D.C. voltage (1000 V or above) to the metal substrate. Examples of such apparatuses include apparatuses for sputtering, ion plating, vacuum deposition, and the like.

As the deposition method in the oxide film formation step b), it is possible to employ those methods which can substitute the gas inside the apparatus by oxygen, can generate oxygen plasma and can apply a positive voltage to the metal substrate. It is possible to use, for example, the apparatuses for sputtering, ion plating, and so forth.

As the deposition method in the durable film formation step c), it is possible to employ those methods which can substitute the gas inside the apparatus by an inert gas, and can make vapor phase deposition of a corrosion-resistant material to the metal substrate. This step can be carried out in the apparatus for sputtering, ion plating, vacuum deposition, and so forth, for example.

Next, the three steps of the present invention will be explained about the sputter deposition method by way of example, with reference to the drawings.

Figure 1:
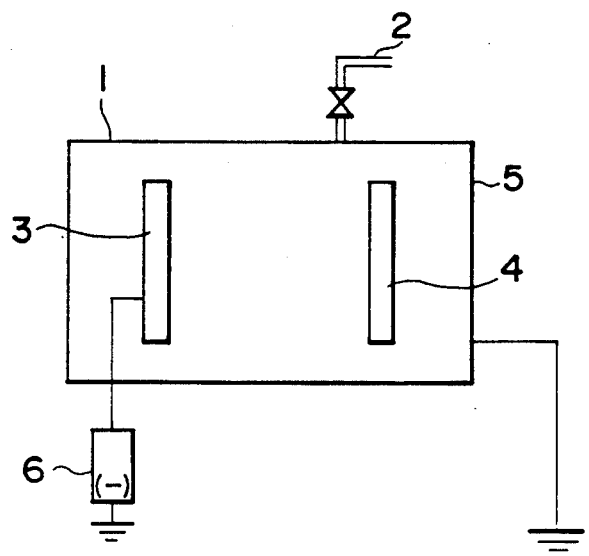
FIGS. 1 to 3 are explanatory views showing an embodiment of the present invention using a sputter deposition method.

The etching step is carried out in the following way. An inert gas such as an argon gas is introduced into a vacuum apparatus 1 shown in FIG. 1 through a gas inlet pipe 2 and a metal substrate 3 and a target 4 are placed in parallel with each other inside the vacuum apparatus 1. When a D.C. voltage is applied to a power source of a cathode 6 using the metal substrate 3 as the cathode and the wall 5 of the apparatus as the opposed electrode, plasma develops between the metal substrate 3 and the wall 5, thereby generating irradiation ions. The thus generated irradiation ions remove a naturally occurring oxide film on the surface of the metal substrate 3 and remaining dirts on the surface such as oil, and an active surface thus appears.

Figure 2:
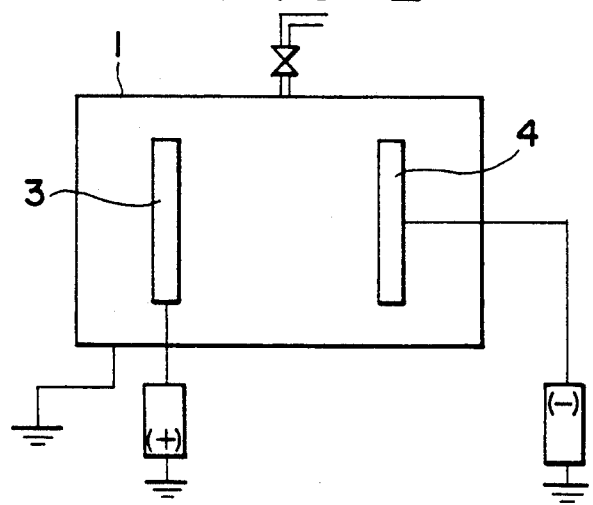

The oxide film formation step is carried out in the following way. As shown in FIG. 2, an oxygen gas or a mixed gas of an oxygen gas and an inert gas is introduced into the vacuum apparatus 1 through the gas inlet pipe 2 and discharge is effected between the target 4 and the wall 5 to generate an oxygen plasma and to apply a positive potential to the metal substrate 3. The thus ionized oxygen is attracted to the surface of the metal substrate 3 and the surface of the metal substrate 3 is oxidized.

Figure 3:
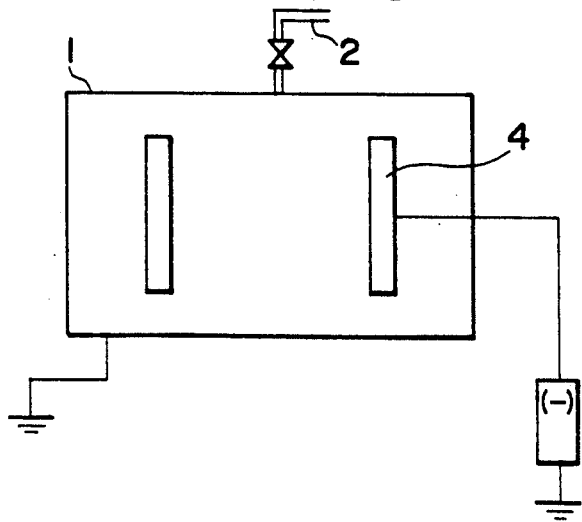

The durable film formation step is carried out in the following way As shown in FIG. 3, an inert gas such as an argon gas is introduced into the vacuum apparatus 1 through the gas inlet pipe 2, and the target 4 as the cathode is disposed inside the apparatus in parallel with the metal material 3. When the voltage is applied to the target 4, discharge occurs between the target 4 and the wall 5 of the apparatus, thereby generating an inert gas plasma. When the high energy ions in the inert gas plasma are irradiated to the target 4, metal molecules (ions, atoms, clusters, etc.) constituting the target 4 are driven out from the target 4 and adhere onto the clean oxide film on the surface of the metal substrate 3 or onto the metal surface thin film which is formed continuously from the oxide film.

Figure 4:
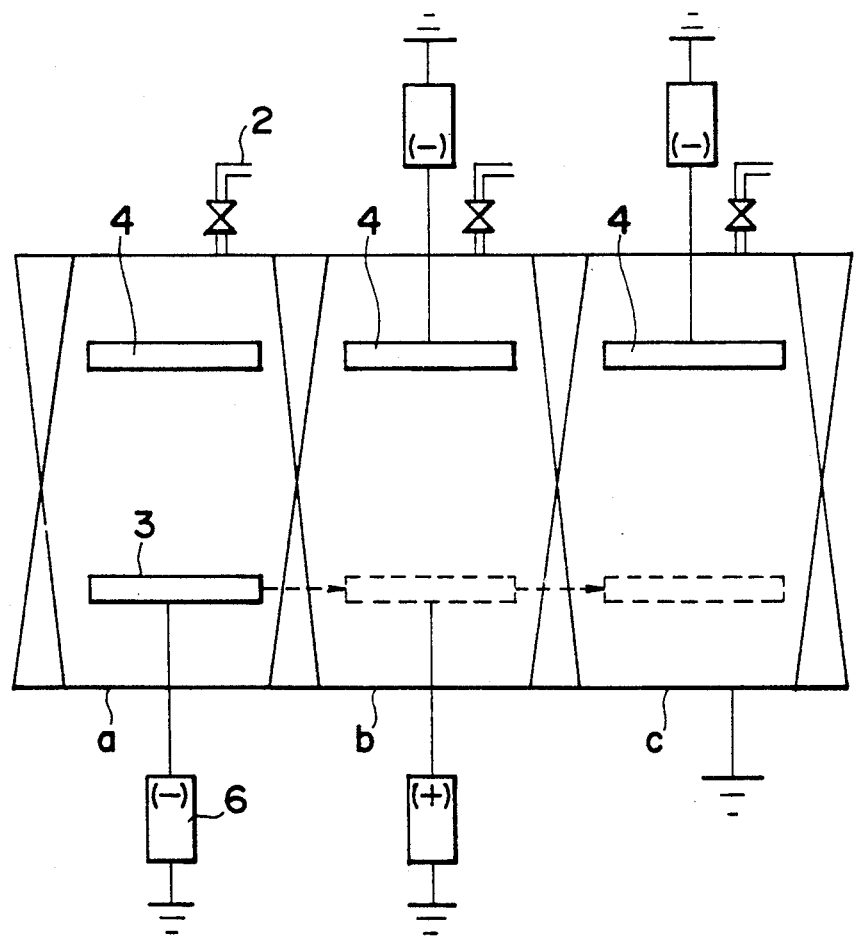
FIG. 4 is an explanatory view of an embodiment wherein each step is carried out continuously.

FIG. 4 shows an apparatus for carrying out continuously the etching step a, the oxide film formation step b and the durable film formation step c by the movement of the metal substrate 3. The treating chambers for these steps are disposed continuously and the metal substrate 3 is moved sequentially. The construction of each chamber is fundamentally the same as the one shown in FIGS. 1 through 3. In this case, the substrate surface or the film surface is formed to be active or clean and since replacement of O₂ with Ar inside the chamber can be made gradually, adhesion of the thin film on the surface of the metal substrate becomes extremely high.

Figure 5:
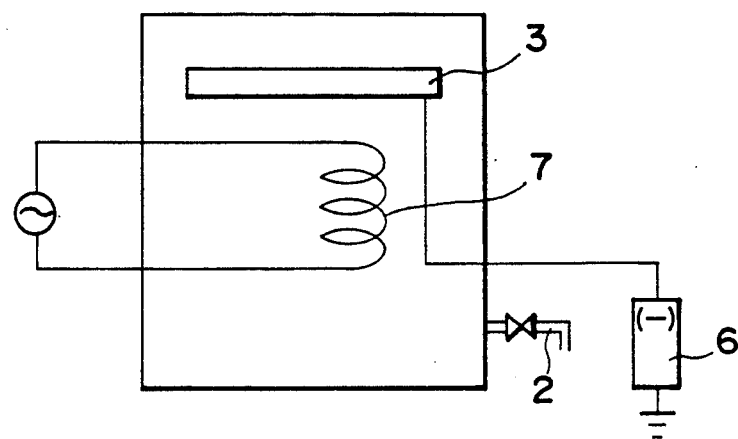
FIGS. 5 to 7 are explanatory views of an embodiment of the present invention using an ion plating method.
Figure 6:
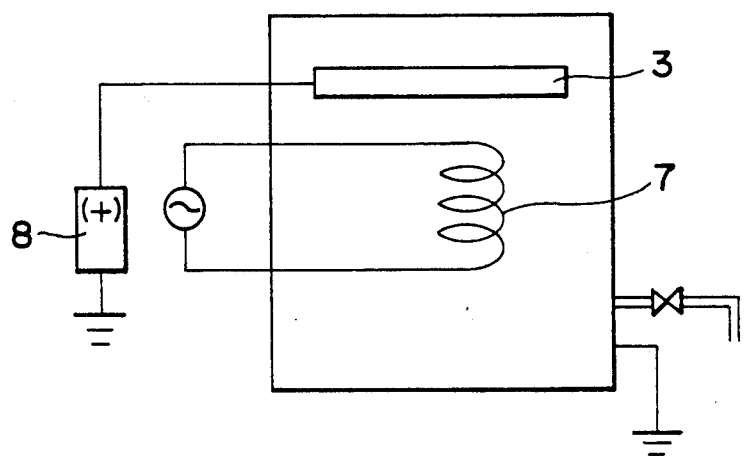
Figure 7:
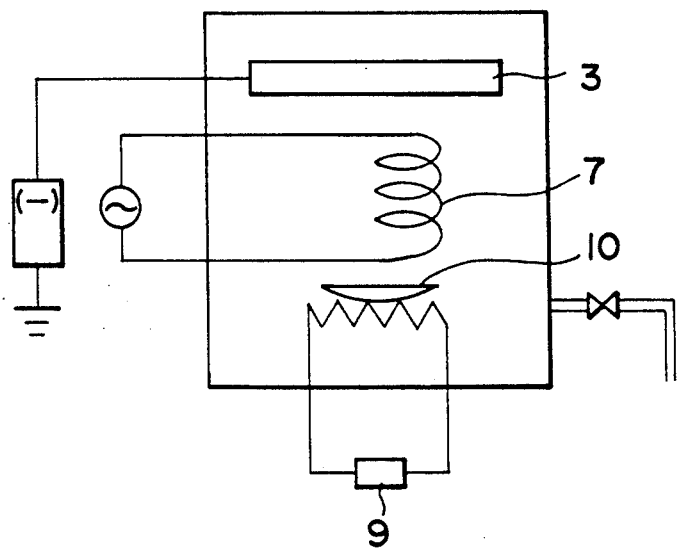

FIGS. 5 through 7 are explanatory views when the present invention is practiced by use of an ion plating apparatus. Reference numeral 7 in these drawings represents a high frequency coil. Reference numeral 8 in FIG. 6 represents a bias voltage application device for controlling the oxide and reference numeral 9 in FIG. 7 represents a power application device for controlling the evaporation quantity of an evaporation source 10.

Next, Example of the present invention and its Comparative Example will be explained.

EXAMPLE

A 1.2 mm-thick AA 6063 aluminum extruded sheet having a size of 50 mm×90 mm was used as a sample.

Pretreatments such as degreasing, chemical etching and washing were carried out when contamination of the sample surface was severe.

After the pretreatments, a metal single layer coating was applied using titanium as a target, through the following steps a to e using a magnetron system sputtering apparatus.

a. Drying:
The inside of the apparatus evacuated.

b. Dry etching (etching step of this invention):
An argon gas was used as the introduction gas. While the inside of the apparatus was being continuously evacuated, the argon gas was supplied at a flow rate of 200 to 250 sccm and processing was effected at an applied voltage of 1,000 to 1,400 V.

c. Exhaust:
The inside of the apparatus was exhausted to $2\times10^{-5}$ mbar or below.

d. Pre-sputtering:
A shutter was disposed so as to oppose the target in the distance of 50 mm. While the inside of the apparatus was being exhausted continuously, the argon gas as the introduction gas was supplied at a flow rate of 150 to 200 sccm and processing was effected at an applied power of 1.5 kW.

e. Metal coating:
The sample was disposed to face the target in the distance of 50 mm. While the inside of the apparatus as being exhausted continuously, the argon gas was supplied at a flow rate of 150 to 200 sccm and processing was effected at an applied power of 1.5 kW.

After the steps a to c described above, the oxide and the metal multiple-coating were applied by the following steps.

f. Pre-sputtering:
The shutter was disposed so as to oppose the target in the distance of 50 mm and while the inside of the apparatus was being exhausted continuously, an oxygen gas was introduced at a flow rate of 180 to 200 sccm and processing was effected at an applied power of 1.5 kW.

g. Oxidation treatment (oxide film formation step of this invention):
The sample was disposed so as to oppose the target in the distance of 50 mm and while the inside of the apparatus was being exhausted continuously, an oxygen gas as the introduction gas was supplied at a flow rate of 180 to 220 sccm and processing was effected at an applied power of 1.5 kW.

h. Intermediate processing:
The ratio of argon and oxygen in the introduction gas was changed from 0:1 to 1:0 and the intermediate processing was carried out in the following way:

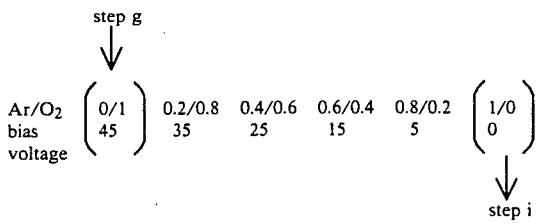

i. Metal coating (durable film formation step of this invention):
The sample was disposed so as to oppose the target in the distance of 50 mm and while the inside of the apparatus was being exhausted continuously, an argon gas as the introduction gas was supplied at a flow rate of 150 to 200 sccm and processing was effected at an applied power of 1.5 kW.

The film formed by the steps described above had the following properties.

Metal single layer coating:
A 1.5 μm-thick titanium film was observed on the aluminum substrate and the boundary between the substrate and the film surface was confirmed.

Oxide-metal multiple-coating:
A 0.6 μm-thick oxide film and a 1.5 μm-thick metal titanium film were observed on the aluminum substrate but none of the boundaries were clear and distinct.

Corrosion resistance of the two kinds of samples described above and a non-processed sample was examined by a contact test with 5% HCl. More definitely, an acrylic ring (inner diameter: 30 mm, height: 30 mm) was placed on the surface of each sample, the contact portion between the ring and the sample was sealed by vaseline and the hydrochloric acid solution was poured into the ring. Observation was made for one hour.

One hour later, corrosion was observed in all the portions of the non-processed sample which came into contact with the hydrochloric acid solution. In the metal single layer coating, the metal film was peeled and corrosion occurred on the entire surface of its contact portion with the solution. In the sample having the oxide and metal multiple coating, however, no peel of the metal film occurred.

As described above, since the formation method of the metal surface thin film in accordance with the present invention forms the oxide film (insulation film) between the metal substrate surface and the durable film, it can form the film suitable for the intended application as the durable surface on the oxide film irrespective of the material of the metal substrate, and even if any pin-holes exist from the durable film to the surface of the metal substrate through the oxide film, electrical corrosion does not occur because the metal substrate and the durable film are not in direct contact with each other. Accordingly, the metal surface thin film formed by the present invention is useful for prevention of electrical corrosion. When all the steps are carried out inside series of apparatuses or inside one apparatus, the oxide film and the durable film formed in the manner described above are formed on the active or clean surfaces, and, moreover, they are formed by the deposition method in vacuo. Since the shift from the oxide film to the durable film is made by gradually substituting the oxygen gas inside the apparatus by the inert gas, corrosion does not occur from the boundary between these films and their adhesion is high, too.

What is claimed is:

1. A method of forming a metal surface thin film having high corrosion resistance and high adhesion by carrying out sequentially the following steps a) through c):

a) an etching step carried out by applying a negative D.C. voltage to a metal substrate inside an apparatus having an inert gas atmosphere;
b) an oxide film formation step for forming an oxide film by generating an oxygen plasma inside an apparatus having an oxygen gas atmosphere and applying a positive voltage to the surface of said metal substrate; and
c) a durable film formation step for forming a durable film by vapor phase deposition of a corrosion-resistant material onto the surface of said metal substrate inside said apparatus having an inert gas atmosphere.

* * * * *